(12) United States Patent
Magen et al.

(10) Patent No.: US 10,038,431 B1
(45) Date of Patent: Jul. 31, 2018

(54) CURRENT MIRROR ARRAY FOR HIGH-FREQUENCY CLOCK GENERATOR

(71) Applicant: Nuvoton Technology Corporation, Hsin-chu (TW)

(72) Inventors: On Magen, Yaaf (IL); Ido Miller, Herzliya (IL)

(73) Assignee: NUVOTON TECHNOLOGY CORPORATION, Hsin-Chu (TW)

( * ) Notice: Subject to any disclaimer, the term of this patent is extended or adjusted under 35 U.S.C. 154(b) by 0 days.

(21) Appl. No.: 15/610,648

(22) Filed: Jun. 1, 2017

(51) Int. Cl.
*H03K 3/00* (2006.01)
*H03K 5/131* (2014.01)
*G05F 3/16* (2006.01)

(52) U.S. Cl.
CPC ............... *H03K 5/131* (2013.01); *G05F 3/16* (2013.01)

(58) Field of Classification Search
None
See application file for complete search history.

(56) References Cited

U.S. PATENT DOCUMENTS

| | | | | |
|---|---|---|---|---|
| 4,523,140 A * | 6/1985 | Schneider | ............... | G05F 3/265 323/315 |
| 5,400,027 A * | 3/1995 | Moyal | .................. | H03M 1/745 341/136 |
| 6,169,314 B1 | 1/2001 | Wong et al. | | |
| 6,703,956 B1 * | 3/2004 | Mueller | ................ | H03M 1/682 341/136 |
| 8,164,499 B1 * | 4/2012 | Booth | .................. | H03M 1/662 338/309 |
| 9,378,314 B2 * | 6/2016 | Kundu | ................ | G06F 17/5036 |
| 2002/0109618 A1 * | 8/2002 | Clara | ...................... | H03M 1/66 341/136 |
| 2005/0044522 A1 * | 2/2005 | Maeda | ................ | G06F 17/5068 716/53 |
| 2005/0132314 A1 * | 6/2005 | Chen | .................... | G06F 17/5068 716/115 |
| 2009/0146719 A1 * | 6/2009 | Pernia | ...................... | H03B 5/04 327/291 |
| 2012/0304140 A1 * | 11/2012 | Boshart | ............... | G06F 17/5036 716/112 |
| 2015/0229308 A1 * | 8/2015 | Shih | ................. | H03K 19/01852 327/112 |

OTHER PUBLICATIONS

EE World Online Resource Forum, correspondence regarding "how do I connect dummy layout element", p. 2, Apr. 13, 2006 (downloaded from http://www.edaboard.com/thread61864.html).

* cited by examiner

*Primary Examiner* — Cassandra Cox
(74) *Attorney, Agent, or Firm* — D. Kligler IP Services Ltd.

(57) ABSTRACT

An electronic circuit includes a plurality of current-mirror devices, which are physically laid-out in an array and are configured to receive a digital word, to further receive a reference current, and to convert the digital word into an output current by mirroring the reference current. The current-mirror devices include (i) first current-mirror devices, which are laid-out along a perimeter of the array and are configured to generate a fixed baseline component of the output current that is independent of the digital word, and (ii) second current-mirror devices, which are laid-out in an interior of the array and are configured to generate a programmable component of the output current that depends on the digital word.

7 Claims, 2 Drawing Sheets

| DUM | PDC | PDC | PDC | PDC | PDC | PDC | PDC | PDC | PDC | DUM |
|---|---|---|---|---|---|---|---|---|---|---|
| PDC | P4 | P4 | P4 | P4 | P4 | P4 | P4 | P4 | P4 | PDC |
| PDC | P3 | P4 | P3 | P2 | P2 | P2 | P3 | P4 | P3 | PDC |
| PDC | P4 | P4 | P3 | P1 | P0 | P1 | P3 | P4 | P4 | PDC |
| PDC | P4 | P3 | P3 | P2 | DUM | P2 | P3 | P3 | P4 | PDC |
| PDC | P3 | P4 | P3 | P1 | P0 | P1 | P3 | P4 | P3 | PDC |
| PDC | P4 | P4 | P3 | P2 | P2 | P2 | P3 | P4 | P4 | PDC |
| PDC | P4 | P4 | P4 | P4 | P4 | P4 | P4 | P4 | P4 | PDC |
| DUM | PDC | PDC | PDC | PDC | PDC | PDC | PDC | PDC | PDC | DUM |

CURRENT MIRROR ARRAY FOR HIGH-FREQUENCY CLOCK GENERATOR

FIELD OF THE INVENTION

The present invention relates generally to generation of clock signals, and particularly to methods and systems for generating clock signals using current-mirror devices.

BACKGROUND OF THE INVENTION

Current-mirror circuits are used in a wide variety of applications. A current mirror circuit typically aims to copy ("mirror") the electrical current flowing through an active device (e.g., a transistor), by controlling the current in another device. A current mirror circuit is typically designed such that its output current is independent of load. A current-mirror device may mirror a constant current (e.g., in a Constant Current source—CCS) or a time-varying current (e.g., in a current amplifier).

SUMMARY OF THE INVENTION

An embodiment of the present invention that is described herein provides an electronic circuit including a plurality of current-mirror devices. The current-mirror devices are physically laid-out in an array and are configured to receive a digital word, to further receive a reference current, and to convert the digital word into an output current by mirroring the reference current. The current-mirror devices include (i) first current-mirror devices, which are laid-out along a perimeter of the array and are configured to generate a fixed baseline component of the output current that is independent of the digital word, and (ii) second current-mirror devices, which are laid-out in an interior of the array and are configured to generate a programmable component of the output current that depends on the digital word.

In some embodiments, each of the current-mirror devices includes one or more transistors, and the array has multiple rows and multiple columns populated with the transistors, such that any transistor belonging to the second current-mirror devices is surrounded on all sides by neighboring transistors. In an embodiment, the array includes at least one dummy transistor.

In some embodiments, the digital word specifies a frequency of a clock signal, and the circuit further includes a signal generation circuit configured to generate the clock signal and to adapt the frequency of the clock signal in response to the output current produced by the array of current-mirror devices. In an embodiment, the plurality of current-mirror devices is further configured to generate an additional output current by mirroring the reference current, and the signal generation circuit is configured to generate a positive part of the clock signal based on the output current, and to generate a negative part of the clock signal based on the additional output current.

There is additionally provided, in accordance with an embodiment of the present invention, a method including receiving a digital word. The digital word is converted into an output current by mirroring a reference current using a plurality of current-mirror devices that are physically laid-out in an array, by (i) generating a fixed baseline component of the output current, independently of the digital word, using first current-mirror devices that are laid-out along a perimeter of the array, and (ii) generating a programmable component of the output current, depending on the digital word, using second current-mirror devices that are laid-out in an interior of the array.

There is further provided, in accordance with an embodiment of the present invention, a method for producing an electronic circuit. The method includes laying-out, along a perimeter of an array, first current-mirror devices, which are configured to generate a fixed baseline component of an output current that is independent of a digital word provided to the electronic circuit. Second current-mirror devices, which are configured to generate a programmable component of the output current that depends on the digital word, are laid-out in an interior of the array.

The present invention will be more fully understood from the following detailed description of the embodiments thereof, taken together with the drawings in which:

DETAILED DESCRIPTION OF EMBODIMENTS

Overview

Figure 1:
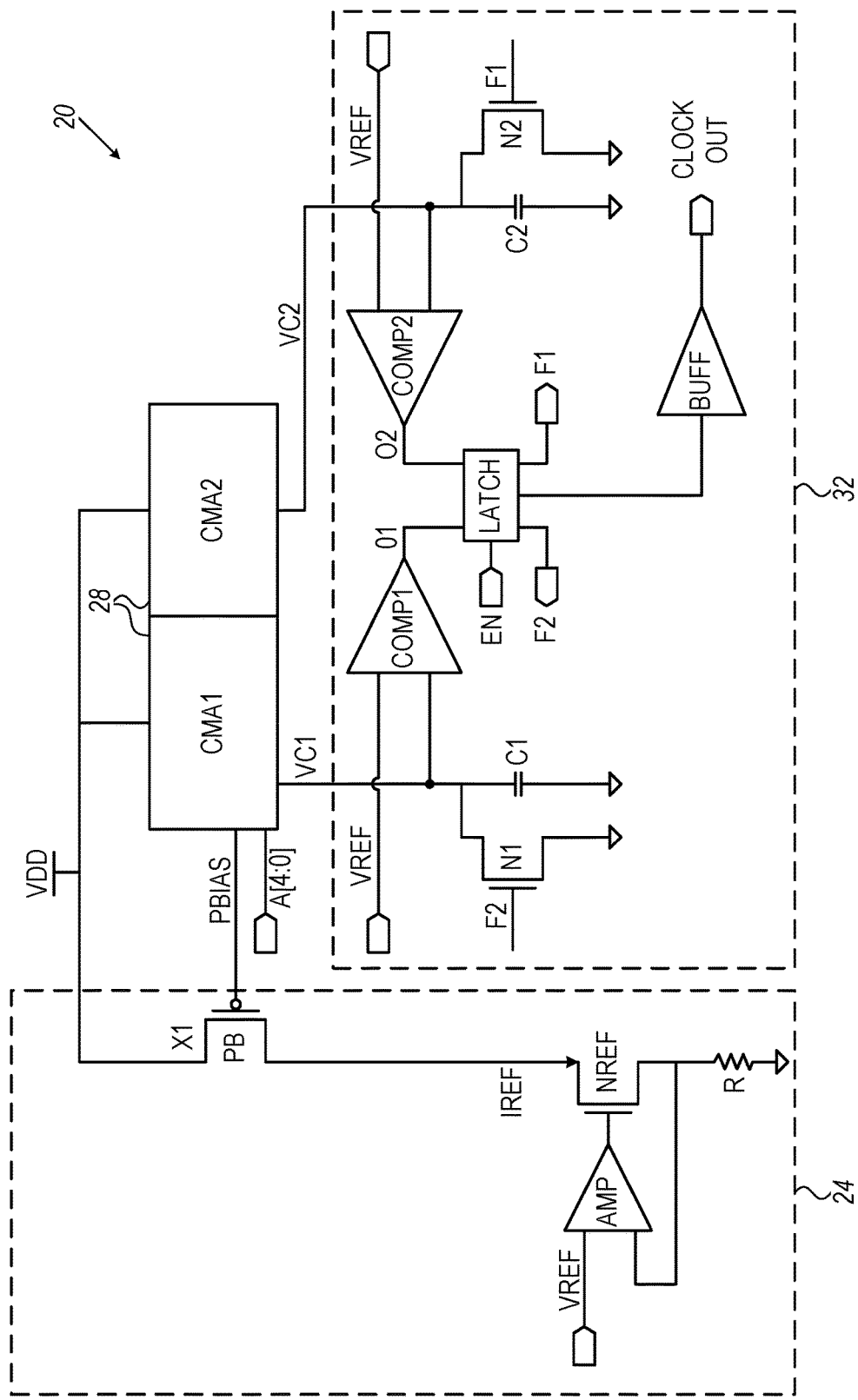
FIG. 1 is a block diagram that schematically illustrates a clock generator, in accordance with an embodiment of the present invention.

Embodiments of the present invention that are described herein provide improved electronic circuits for digital-to-current (D2I) conversion, and associated methods. In some embodiments, the disclosed D2I conversion circuits are used as part of a programmable-frequency clock-signal generator.

In a disclosed embodiment, a D2I circuit is configured to receive a digital word, to further receive a reference current, and to convert the digital word into an output current by mirroring the reference current. The D2I circuit comprises a plurality of current-mirror devices that are physically laid-out in a two-dimensional array (referred to as Current-Mirror Array—CMA).

Some of the current-mirror devices in the CMA (referred to as "fixed current-mirror devices") are configured to generate a fixed baseline component of the output current that is independent of the digital word. The remaining current-mirror devices (referred to as "selectable current-mirror devices") are configured to generate a programmable component of the output current that depends on the digital word.

As will be explained in detail below, the physical layout of the CMA is designed in accordance with two design considerations. The first consideration is that the selectable current-mirror devices are typically more sensitive to performance variations than the fixed current-mirror devices. One reason for this difference is that it is considerably simpler to calibrate the D2I circuit to compensate for errors in the fixed current-mirror devices, that in the selectable current-mirror devices.

The second design consideration is that current-mirror devices along the perimeter of the array typically suffer from "edge effects" that cause higher performance variations, relative to current-mirror devices located in the interior of the array. One reason for this difference is that current-mirror devices located in the interior of the array all have the same symmetrical arrangement of neighboring devices around them. Current-mirror devices along the perimeter, on the other hand, have a different, asymmetrical arrangement of neighboring devices.

The disclosed D2I circuits are designed for optimal performance and minimal die area, given the two design considerations above. In the disclosed embodiments, the physical layout of the CMA is designed such that (i) the fixed current-mirror devices are laid-out along the perimeter of the array, and (ii) the selectable current-mirror devices are laid-out in an interior of the array.

In this scheme, the more sensitive devices are located in the symmetrical and repeatable environment of the interior. The perimeter, which is susceptible to edge effects, is used for placing the less sensitive devices.

By using this solution, the D2I conversion circuit is able to generate a highly accurate programmable output current over a wide range of process variations and operating conditions, without requiring complex calibration. Since the disclosed solution eliminates the need for (or at least reduces the number of) dedicated dummy devices along the perimeter, the disclosed D2I conversion circuit can be implemented on a small die area. Clock generators that are based on such D2I conversion circuit can therefore achieve high accuracy, small size and low-cost.

System Description

FIG. 1 is a block diagram that schematically illustrates a clock generator circuit 20, in accordance with an embodiment of the present invention. Clock generator 20 generates a clock signal, for example for clocking electronic circuitry in an Integrated Circuit (IC). The clock signal (denoted "CLOCK OUT" in the figure) has a programmable frequency that is set by a digital word (in the present example a 5-bit word denoted A[4:0] in the figure).

In one example embodiment, clock generator 20 is configured to generate clock frequencies between 100-120 MHz (i.e., has a baseline clock frequency of 100 MHz, and a programmable offset between 0-20 MHz). Alternatively, any other suitable frequency range can be used. Clock generator generates the clock signal with highly accurate frequency and duty cycle, over varying Process, Voltage and Temperature (PVT) conditions, using techniques that are described in details herein.

In the present example, clock generator 20 comprises a current source circuit 24, two Current Mirror Arrays (CMAs) 28 denoted CMA1 and CMA2, and a comparator and latch circuit 32. Current source 24 comprises an operational amplifier denoted AMP, a Negative-channel Metal Oxide Semiconductor (NMOS) Field-Effect Transistor (FET) denoted NREF, a Positive-channel MOS (PMOS) FET denoted PB, and a resistor denoted R. Current source 24 is connected to a supply voltage VDD, and receives as input an accurate reference voltage denoted VREF. The current source produces a regulated reference current denoted IREF, wherein IREF=VREF/R. Current IREF flows through transistor PB, so as to generate a bias signal denoted PBIAS.

Figures 2, 3:
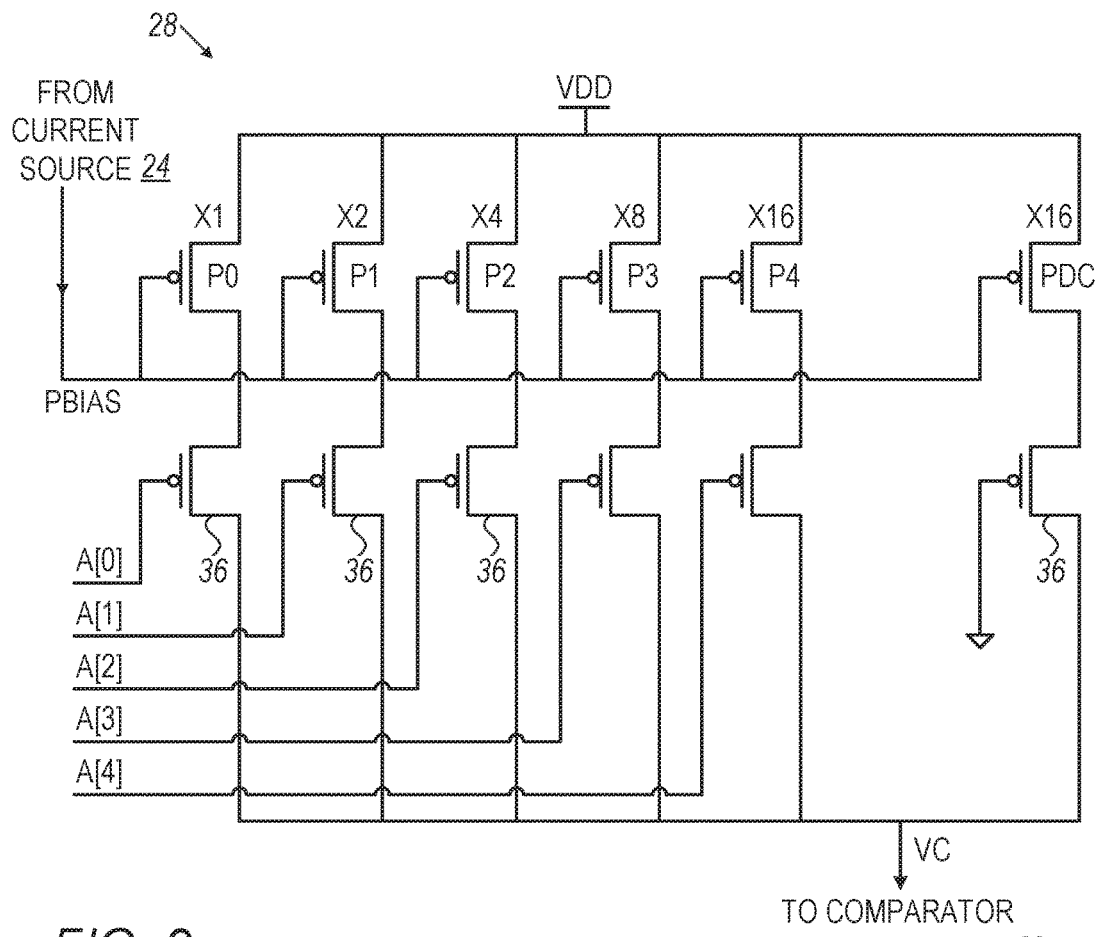
FIG. 2 is a diagram that schematically illustrates a digital-to-current (D2I) conversion circuit used in the clock generator of FIG. 1, in accordance with an embodiment of the present invention.
FIG. 3 is a diagram that schematically illustrates a physical layout of a pair of current-mirror arrays, in accordance with an embodiment of the present invention.

Each CMA 28 (each of CMA1 and CMA2) comprises an array of current-mirror devices, which mirror the current produced by current source 24. Each CMA receives as input the bias signal PBIAS and the digital word A[4:0]. The CMA activates a selected subset of the current mirror devices, depending on the value of the digital word A[4:0]. As a result, the CMA generates an output current signal denoted VC (VC1 for CMA1, and VC2 for CMA2), whose magnitude depends on the value of the digital word. In other words, each CMA serves as a programmable "digital-to-current" (D2I) converter. The internal structure and physical layout of CMAs 28 are shown in FIGS. 2 and 3 below.

The two current signals VC1 and VC2 are provided as input to comparator and latch circuit 32. As will be explained below, signal VC1 (generated by CMA1) controls the duration of the positive part of the clock signal, and signal VC2 (generated by CMA2) controls the duration of the negative part of the clock signal.

In the present embodiment, comparator and latch circuit 32 comprises two comparators denoted COMP1 and COMP2, and a dual-input set-reset latch denoted LATCH. Comparator and latch circuit 32 generates each cycle of the clock signal by a charge-cycle driven by CMA1, followed by a charge-cycle driven by CMA2. The clock generation process initially begins when an enable signal (denoted EN) is asserted.

Upon assertion of EN, the charge-cycle of CMA1 begins. Signal VC1 begins to charge a capacitor C1, and the voltage across C1 thus gradually increases. Comparator COMP1 compares the voltage across capacitor C1 to the reference voltage VREF. When the voltage across C1 reaches VREF, the output of COMP1 (denoted O1) rises to logical "1" and activates the SET input of LATCH. The activation of LATCH causes three events:

- The output of LATCH sets CLOCK OUT to logical "1" via a buffer BUFF. The positive part of the clock cycle begins.
- A signal F2 rises to logical "1", which switches-on an NMOS transistor N1 that discharges capacitor C1 (in preparation for the next charge-cycle of CMA1).
- A signal F1 falls to logical "0" and triggers CMA2 to begin its charge-cycle.

The charge-cycle of CMA2 begins with signal VC2 charging a capacitor C2. The voltage across C2 thus increases gradually. Comparator COMP2 compares the voltage across capacitor C2 to the reference voltage VREF. When the voltage across C2 reaches VREF, the output of COMP2 (denoted O2) rises to logical "1" and activates the RESET input of LATCH. The activation of LATCH causes three events:

- The output of LATCH sets CLOCK OUT to logical "0" via the buffer. The negative part of the clock cycle begins.
- Signal F1 rises to logical "1", which switches-on an NMOS transistor N2 that discharges capacitor C2 (in preparation for the next charge-cycle of CMA2).
- Signal F2 falls to logical "0" and triggers CMA1 to begin its charge-cycle.

The process described above is repeated as long as the enable signal EN is high, generating successive cycles of CLOCK OUT. If EN is set to "0", the clock signal is deactivated.

From the description above it can be seen that the frequency accuracy of the "CLOCK OUT" signal is determined by the accuracy of VC1 and VC2 (more specifically, by the accuracy of VC1+VC2). Additionally, the accuracy of the duty-cycle of the "CLOCK OUT" signal is determined by the accuracy of VC1/VC2. For example, in order to maintain an accurate duty-cycle of 50%, it is important to maintain VC1=VC2. These relations should typically be maintained across the specified range of operating conditions of clock generator 20, as well as over the expected manufacturing process variations.

Current-Mirror Array Configuration

FIG. 2 is a diagram that schematically illustrates a digital-to-current (D2I) conversion circuit based on CMA 28, in accordance with an embodiment of the present invention. As noted above, each CMA 28 serves as a programmable "digital-to-current" (D2I) converter. The CMA output, denoted VC, is a current signal whose magnitude depends on the value of the digital word A[4:0]. CMA1 and CMA2 of clock generator 20 (FIG. 1) may be implemented in this manner, in which case VC1 corresponds to the output (VC) of CMA1, and VC2 corresponds to the output (VC) of CMA2.

In the present embodiment, CMA 28 comprises six current-mirror devices denoted P0, P1, P2, P3, P4 and PDC. The sources of the current-mirror devices are connected to the supply voltage VDD. The drains of the current-mirror devices are connected to the output of the CMA (denoted VC in the figure) via respective switches 36. The gates of the current-mirror devices are connected to the bias signal PBIAS, received from current source circuit 24 (see FIG. 1).

Current-mirror devices P0, P1, P2, P3 and P4 are selectable. For these current-mirror devices, the gates of switches 36 are controlled by the respective bits A[0], A[1], A[2], A[3] and A[4] of the digital word. Thus, for each of P0, P1, P2, P3 and P4, the current produced by the current-mirror device can be connected to the output (VC) or disconnected from the output depending on whether the corresponding bit value is "0" or "1".

Current-mirror device PDC, on the other hand, is fixed. Switch 36 of this current-mirror device is connected to ground constantly. The current produced by the current-mirror device PDC is connected to the output (VC) regardless of the bit values of A[4:0].

In the present example, each current-mirror device comprises one or more PMOS transistors. Specifically, P0 comprises a single PMOS, P1 comprises two PMOS transistors connected in parallel (i.e., the sources connected to one another, and similarly the drains connected to one another), P2 comprises four PMOS transistors connected in parallel, P3 comprises eight PMOS transistors connected in parallel, and P4 comprises sixteen PMOS transistors connected in parallel. PDC also comprises sixteen PMOS transistors connected in parallel.

Using this binary configuration, CMA 28 translates the thirty-two possible values of A[4:0] into thirty-two different magnitudes of VC at the CMA output. Referring to FIG. 1, CMA1 converts A[4:0] into VC1 in this manner, and CMA2 converts A[4:0] into VC2 in this manner.

The current produced by PDC sets the baseline component of VC. The sum of the currents produced by the selected subset of P0, P1, P2, P3 and P4 sets the programmable component of VC. When operating in clock generator 20 of FIG. 1, the current produced by PDC sets a fixed baseline frequency, the lower frequency that can be generated by the clock generator. The sum of the currents produced by the selected subset of P0, P1, P2, P3 and P4 sets a programmable frequency offset relative to the baseline frequency of the clock signal.

The circuit configurations of FIGS. 1 and 2 are example configurations that are chosen for the sake of conceptual clarity. In alternative embodiments, the disclosed techniques can be implemented using any other suitable configuration. For example, CMA 28 may comprise any suitable number of selectable current-mirror devices, not necessarily in a binary configuration. The digital word A[0:n] may comprise any suitable number of bits. The magnitude of the baseline component and the resolution of the programmable component of VC (and thus of the clock frequency) can be set to any suitable values. Further alternatively, clock generator 20 may be implemented using a single CMA, or in any other suitable way.

In some embodiments, some or all the elements of clock generator circuit 20 may be fabricated using a conventional Complementary Metal Oxide Semiconductor (CMOS) process, possibly together with the rest of the electronic circuit (e.g., IC) in which it is embedded. Additionally or alternatively, some or all the elements of clock generator circuit 20 may be fabricated in an Application-Specific Integrated Circuit (ASIC) or Field-Programmable Gate Array (FPGA), or even using discrete components.

Current-Mirror Array Physical Layout Considerations

As explained above, in the embodiment of FIGS. 1 and 2, CMAs 28 of clock generator 20 comprise the following current-mirror devices:

TABLE 1

| | Transistor count per type of current-mirror device | | |
|---|---|---|---|
| Type | Selectable or Fixed | # of transistors per CMA | Total # of transistors in clock generator |
| P0 | Selectable | 1 | 2 |
| P1 | Selectable | 2 | 4 |
| P2 | Selectable | 4 | 8 |
| P3 | Selectable | 8 | 16 |
| P4 | Selectable | 16 | 32 |
| PDC | Fixed | 16 | 32 |

The total number of PMOS transistors in this example is 2+4+8+16+32+32=94. In some embodiments, CMA1 and CMA2 are implemented as part of a suitable IC, in which the 94 transistors are laid-out on a substrate and interconnected with the additional CMA hardware.

Various possible physical layouts can be chosen for placing the 94 transistors. One major design consideration is to minimize variations in electrical and functional behavior and performance among different current-mirror devices. In other words, it is desirable that each current-mirror device will be subjected to substantially the same physical and electrical environment, in order to guarantee similarity in electrical and functional behavior and performance.

When placing the PMOS transistors in an array, transistors that are located along the perimeter of the array experience different conditions than transistors located in the interior of the array. For example, the transistors located in the interior of the array all have the same symmetrical arrangement of neighboring transistors around them. The transistors along the perimeter, on the other hand, have a different, asymmetrical arrangement of neighboring transistors.

Due to this "edge effect," the performance of the transistors along the perimeter is typically less uniform, less repeatable, than that of the transistors in the interior of the array.

Another design consideration is that the selectable current-mirror devices (P0-P4) are more sensitive to performance variations than the fixed current-mirror devices (PDC). One reason for this difference is that, in some embodiments, the clock frequency of clock generator 20 is calibrated during production. Calibration of the minimal, baseline clock frequency (which is determined by the fixed current-mirror device PDC) is relatively short and straightforward. Calibration of the many possible offset frequencies (determined by the selectable current-mirror devices P0-P4) is considerably more complex, lengthy, memory-consuming and expensive.

Another reason for the difference in sensitivity to performance variations between the fixed and selectable current-mirror devices, is that the fixed current-mirror devices (PDC) do not affect the frequency step-size (also referred to as "frequency slope") of clock generator 20. Any mismatch between selectable current-mirror devices might create undesired (positive or negative) "jumps" in the slope, which degrade calibration accuracy and can create clock jitter and other impairments. These effects are particularly noticeable when calibration is performed in real-time during operation of the clock generator, e.g., to overcome temperature drift and supply-voltage variations.

In view of the above design considerations, in some embodiments of the present invention, the physical layout of CMA 28 is chosen such that (i) the PMOS transistors of the fixed current-mirror devices (PDC) are placed along the perimeter of the array, and (ii) the PMOS transistors of the selectable current-mirror devices (P0, P1, P2, P3 and P4) are placed in the interior of the array. This layout provides best performance and best area utilization, since the more sensitive transistors are placed at locations having less performance variations, and vice versa.

FIG. 3 is a diagram that schematically illustrates the joint physical layout of CMA1 and CMA2 of clock generator 20, in accordance with an embodiment of the present invention. The figure corresponds to a top view of the die area of the IC in which CMA1 and CMA2 are implemented. Each position ("cell") in the figure corresponds to a respective PMOS transistor, and is labeled with the type of current-mirror device (P0, P1, P2, P3, P4 or PDC) it belongs to.

As can be seen in the figure, all the transistors belonging to the selectable current-mirror devices (P0, P1, P2, P3 and P4) are located in the interior of the array. The transistors belonging to the fixed current-mirror devices (PDC) are located along the perimeter of the array. The count of transistors, per type of current-mirror device, matches the right-most column of Table 1 above.

In the present example, the array is two-dimensional, i.e., has multiple rows and multiple columns populated with transistors. The chosen layout ensures that any transistor belonging to the selectable current-mirror devices is surrounded on all sides by neighboring transistors.

Note also that, in this embodiment, the transistors of both CMA1 and CMA2 are intermixed in the layout of the same single array. As a result, the output current of CMA1 (VC1) closely matches the output current of CMA2 (VC2), thereby providing a clock signal having a highly accurate duty-cycle.

In the present example, the total count of transistors is 94, whereas the total number of positions in the array is 99. The five remaining positions are populated with dummy transistors (labeled "DUM" in the figure). The dummy transistors do not have a functional role in the clock generator, and are added in order to provide a more uniform environment for the functional transistors that neighbor them.

The physical layout of CMA1 and CMA2 shown in FIG. 3 is an example layout, which is chosen in order to demonstrate the principles of the disclosed technique. In alternative embodiments, any other suitable layout can be used. For example, slight deviations from the above rules (transistors of selectable current-mirror devices in the interior, transistors of fixed current-mirror devices along the perimeter) can be tolerated.

In one alternative embodiment, the total number of transistors in the selectable current-mirror devices is sixty-nine per CMA. The resulting frequency steps are denoted x0.25, x0.5, x1, x2, x4, x8, x16, x32. The fractional steps (x0.25 and x0.5) are implemented by connecting four or two transistors in series, respectively. In addition, the number of transistors in the fixed current-mirror devices is sixteen per CMA. Each CMA further comprises eight transistors used for "extra" current-mirror devices. The "extra" current-mirror devices comprise, for example, devices used for coarse frequency tuning and thus also do not have stringent matching requirements. In addition, the two CMAs comprise twenty-two dummy transistors.

In this embodiment, the size of the array comprising CMA1 and CMA2 is 16-by-13 transistors (a total of 208). All the selectable current-mirror devices are laid-out in the interior of the array. The perimeter of the array is populated with (i) the fixed current-mirror devices, (ii) the "extra", and (iii) ten dummy transistors. Twelve additional dummy transistors are distributed in the interior of the array. The digital words controlling the CMAs in this embodiment are eight-bit words denoted A[7:0]. The control bus comprises four additional bits for controlling the "extra" devices for coarse tuning.

In addition, in this embodiment each branch of the CMA (i.e., the x1 branch, the x2 branch, the x4 branch, the x8 branch, the x16 branch and the PDC branch) comprises an additional PMOS device connected in series with the current-mirror device of the branch. These additional PMOS devices are used for cascode, for improving the VDS effect of the current-mirror devices (P0-P4 and PDC devices). The VDS effect causes the current through the device to change when the drain-source voltage (VDS) across the device chages. The additional cascode devices eliminate this effect and retain the VDS constant, thereby improving the accuracy of the current-mirror devices and the current matching between devices. The gates of the additional cascode devices are biased by a signal PCAS generated in current source circuit 24.

Although the embodiments described herein mainly address clock generators, the methods and systems described herein can also be used in other applications and circuits that involve D2I conversion, i.e., conversion of digital values into electrical currents, such as in general-purpose Digital-to-Analog Converters (DACs).

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An electronic circuit, comprising:
   a plurality of current-mirror devices, which are physically laid-out in an array and are configured to receive a digital word, to further receive a reference current, and to convert the digital word into an output current by mirroring the reference current,
   wherein the current-mirror devices comprise:
   (i) first current-mirror devices, which are laid-out along a perimeter of the array and are configured to generate a fixed baseline component of the output current that is independent of the digital word; and
   (ii) second current-mirror devices, which are laid-out in an interior of the array and are configured to generate a programmable component of the output current that depends on the digital word.

2. The circuit according to claim 1, wherein each of the current-mirror devices comprises one or more transistors, and wherein the array has multiple rows and multiple columns populated with the transistors, such that any transistor belonging to the second current-mirror devices is surrounded on all sides by neighboring transistors.

3. The circuit according to claim 1, wherein the array comprises at least one dummy transistor.

4. The circuit according to claim 1, wherein the digital word specifies a frequency of a clock signal, and comprising a signal generation circuit configured to generate the clock signal and to adapt the frequency of the clock signal in response to the output current produced by the array of current-mirror devices.

5. The circuit according to claim 4, wherein the plurality of current-mirror devices is further configured to generate an additional output current by mirroring the reference current, and wherein the signal generation circuit is configured to generate a positive part of the clock signal based on the output current, and to generate a negative part of the clock signal based on the additional output current.

6. A method, comprising:
   receiving a digital word; and
   converting the digital word into an output current by mirroring a reference current using a plurality of current-mirror devices that are physically laid-out in an array, by:
   (i) generating a fixed baseline component of the output current, independently of the digital word, using first current-mirror devices that are laid-out along a perimeter of the array; and
   (ii) generating a programmable component of the output current, depending on the digital word, using second current-mirror devices that are laid-out in an interior of the array.

7. A method for producing an electronic circuit, the method comprising:
   laying-out, along a perimeter of an array, first current-mirror devices, which are configured to generate a fixed baseline component of an output current that is independent of a digital word provided to the electronic circuit; and
   laying-out, in an interior of the array, second current-mirror devices, which are configured to generate a programmable component of the output current that depends on the digital word.

* * * * *